United States Patent [19]

Boezen et al.

[11] Patent Number: 5,051,708

[45] Date of Patent: Sep. 24, 1991

[54] AMPLIFIER ARRANGEMENT WITH OUTPUT POWER BOOSTING

[75] Inventors: Hendrik Boezen; Pieter Buitendijk; Rudolf W. Mathijssen, all of Nijmegen, Netherlands

[73] Assignee: U.S. Philips Corp., New York, N.Y.

[21] Appl. No.: 540,016

[22] Filed: Jun. 18, 1990

[30] Foreign Application Priority Data

Jul. 14, 1989 [NL] Netherlands .................... 8901824

[51] Int. Cl.$^5$ .................................. H03F 3/04
[52] U.S. Cl. .................. 330/297; 330/261; 330/11; 330/288
[58] Field of Search ............ 330/297, 261, 11, 288

[56] References Cited

U.S. PATENT DOCUMENTS 4,559,502 12/1985 Huijsing .................... 330/297
4,752,747 6/1988 Botti et al. ................ 330/297

Primary Examiner—Eugene R. LaRoche
Assistant Examiner—Tan Dinh
Attorney, Agent, or Firm—Steven R. Biren

[57] ABSTRACT

In order to boost the output power of a first amplifier (A1) a second amplifier (A2) can increase the supply voltage difference across the first amplifier (A1). However, variations of the supply voltage difference result in comparatively high distortion. In order to minimize this distortion while maintaining the output power, a signal-follower circuit generates a direct voltage lever which tracks a first output signal of the first amplifier, for which purpose the signal-follower circuit is driven by a third amplifier, which compares the first output signal with a reference signal.

6 Claims, 2 Drawing Sheets

AMPLIFIER ARRANGEMENT WITH OUTPUT POWER BOOSTING

BACKGROUND OF THE INVENTION

The invention relates to an amplifier arrangement comprising a first amplifier for amplifying an input signal, the first amplifier comprising a first terminal for carrying a boosting voltage, which terminal is coupled to a first supply voltage terminal via a unidirectional element to receive a first supply voltage, a second terminal, which is coupled to a second supply voltage terminal to receive a second supply voltage, a first input terminal for receiving the input signal, and a first output terminal for supplying a first output signal superimposed on a specific direct voltage level, and a second amplifier for varying the boosting voltage on the first terminal depending upon the input signal, the second amplifier comprising a third and a fourth terminal, which are coupled to the first and the second supply voltage terminal respectively, a second input terminal for receiving a measure of the input signal and a second output terminal for supplying a second output signal, which output terminal is coupled to the first terminal by means of a capacitor.

Such an amplifier arrangement is suitable for boosting the output power of an amplifier operating with a small voltage difference between the two supply voltage terminals, as employed, for example, in car radios.

Such an amplifier arrangement is known from U.S. Pat. No. 4,752,747. In this known arrangement a similar input signal is applied to both the first and the second input terminal. This input signal is amplified by the first amplifier, the amplified signal appearing on the first output terminal, which is coupled to a load. However, the input signal is amplified by the second amplifier only if it exceeds a threshold value, the amplifier signal then being available on the second output terminal. Since the second output terminal is coupled to the first terminal via a capacitor, the boosting voltage on the first terminal will track the variations of the second output signal. In relation to the second supply voltage this boosting voltage determines the voltage difference at which the first amplifier is operated. The coupling of the first terminal to the first supply voltage terminal via the uni-directional element imposes a minimum value on the boosting voltage, which value is substantially equal to the first supply voltage. The boosting voltage is equal to said minimum value if the input signal does not exceed the threshold value and varies if the first output signal tends to be limited by the first supply voltage and the input signal consequently exceeds the threshold value. The boosting voltage can then become equal to at the most two times the voltage difference between the first and the second supply voltage terminal. This results in the maximum output power being quadrupled. In order to reach this maximum output power the direct voltage level on the first output terminal should be equal to the first supply voltage, so that the first output signal is centered relative to the maximum output voltage swing. However, for comparatively small input signals such a direct voltage level has the disadvantage that the output signal tends to be limited unnecessarily by the first supply voltage during on an average half the time and that, consequently, boosting voltage variations occur, attend with a comparatively high distortion. This can be reduced by another setting of the direct voltage level on the first terminal but this results in a reduced maximum output power owing to the off-centered position relative to the output voltage swing.

SUMMARY OF THE INVENTION

Accordingly, it is an object of the invention to provide an amplifier arrangement capable of supplying a maximal output power but having a minimal distortion as a result of boosting voltage variations.

An amplifier arrangement in accordance with the invention is characterized in that the amplifier arrangement further comprises a signal-follower circuit for establishing the direct voltage level on the first output terminal and a third amplifier for driving the signal-follower circuit depending upon a comparison between the first output signal and and a reference signal, the third amplifier comprising a third input terminal for receiving a third input signal, which input terminal is coupled to the first output terminal, and a third output terminal for supplying a third output signal, which output terminal is coupled to the signal-follower circuit.

The invention is based on the recognition of the fact that the direct voltage level on the first output terminal should be constantly set to a central level between the boosting voltage and the second supply voltage. This is achieved by locking the first output signal to the direct voltage level, which level is varied if the first output signal tends to be limited by the second supply voltage. For this purpose the first output signal is compared with the reference signal, which is a measure of a maximum permissible first output signal without a variation of the boosting voltage. This comparison results in the third output signal, which drives the signal-follower circuit. A comparatively small first output signal resulting from a comparatively small first input signal will therefore neither effect the direct voltage level nor give rise to boosting voltage variations. However, as soon as an increase of the first input signal results in the reference signal being exceeded the direct voltage level on the first output terminal will track the boosting voltage proportionally. This ensures that the direct voltage level is constantly centered relative to the first output signal swing, so that boosting voltage variations are minimized and the maximum output power is obtained.

A first embodiment of an amplifier arrangement in accordance with the invention may be characterized in that the signal-follower circuit comprises first means, second means and a current-mirror circuit having an input terminal and an output terminal, the input terminal of the current-mirror circuit being coupled both to the first supply voltage terminal by the first means and to the third output terminal and the output terminal of the current-mirror circuit being coupled to the first output terminal by the second means. The signal on the input terminal of the current-mirror circuit then determines the direct voltage level on the first output terminal depending on the current mirror ratio of the current-mirror circuit and the construction of the second means. If the boosting voltage does not vary the magnitude of this signal is related to the construction of the first means. If the boosting voltage exhibits variations the magnitude of the signal is dictated by the third output signal.

A second embodiment of an amplifier arrangement in accordance with the invention may be characterized in that the first means comprise at least a unidirectional element and a resistor, which are coupled in series between the input terminal of the current-mirror circuit and the first supply voltage terminal. The voltage drop across the unidirectional element, which may be provided in multiplicate depending on the construction of the first amplifier, and the value of the resistor then dictate the signal of the input terminal of the current-mirror circuit in the absence of boosting voltage variations.

A third embodiment of an amplifier arrangement in accordance with the invention may be characterized in that the second means comprise at least a resistor, which is coupled between the output terminal of the current-mirror circuit and the first output terminal. The value of the resistor then dictates the direct voltage level on the first output terminal depending on the signal on the output terminal of the current-mirror circuit, for example an output current.

A fourth embodiment of an amplifier arrangement in accordance with the invention may be characterized in that the third amplifier comprises inter alia a differential stage comprising at least two transistors each having a first main electrode, a control electrode and a second main electrode, a current source circuit and a reference-signal circuit, the first main electrodes being coupled both to one another and to the current-mirror circuit, one control electrode being coupled to the first output terminal, the other control electrode being coupled to the reference-signal circuit to receive the reference signal, and one second main electrode being coupled to the third output terminal. The differential stage operates as a threshold circuit for varying the third output signal on the third output terminal. The reference signal constitutes the threshold, which is related to the maximum permissible first output signal in the absence of boosting voltage variations. When the threshold is exceeded the third amplifier will take over the drive of the current-mirror circuit from the first means.

A further embodiment of an amplifier arrangement in accordance with the invention may be characterized in that the arrangement further comprises a fourth and a fifth amplifier, which are coupled and constructed similarly to the first and the second amplifier, the fourth amplifier consequently comprising a fourth output terminal for supplying a fourth output signal superimposed on a further direct voltage level, in that the signal-follower circuit is further adapted to establish the further direct voltage level on the fourth output terminal, and in that the third amplifier is further adapted to drive the signal-follower circuit depending on a comparison between the fourth output signal and the reference signal, the third amplifier comprising a further input terminal, which is coupled to the fourth output terminal. In this embodiment the first and the fourth amplifier constitute a bridge amplifier circuit, whose direct voltage levels on the output terminals are set by the signal-follower circuit via the third amplifier, depending upon the first and the fourth output signal. Owing to the use of an OR gate both direct voltage levels will be corrected if one of said output signals exceeds the reference signal. In this embodiment the second means are provided in duplicate.

BRIEF DESCRIPTION OF THE DRAWING

The invention will now be described in more detail, by way of example, with reference to the accompanying drawing, in which.

In these Figures like parts bear the same reference numerals

DESCRIPTION OF THE PREFERRED EMBODIMENTS

Figure 1:
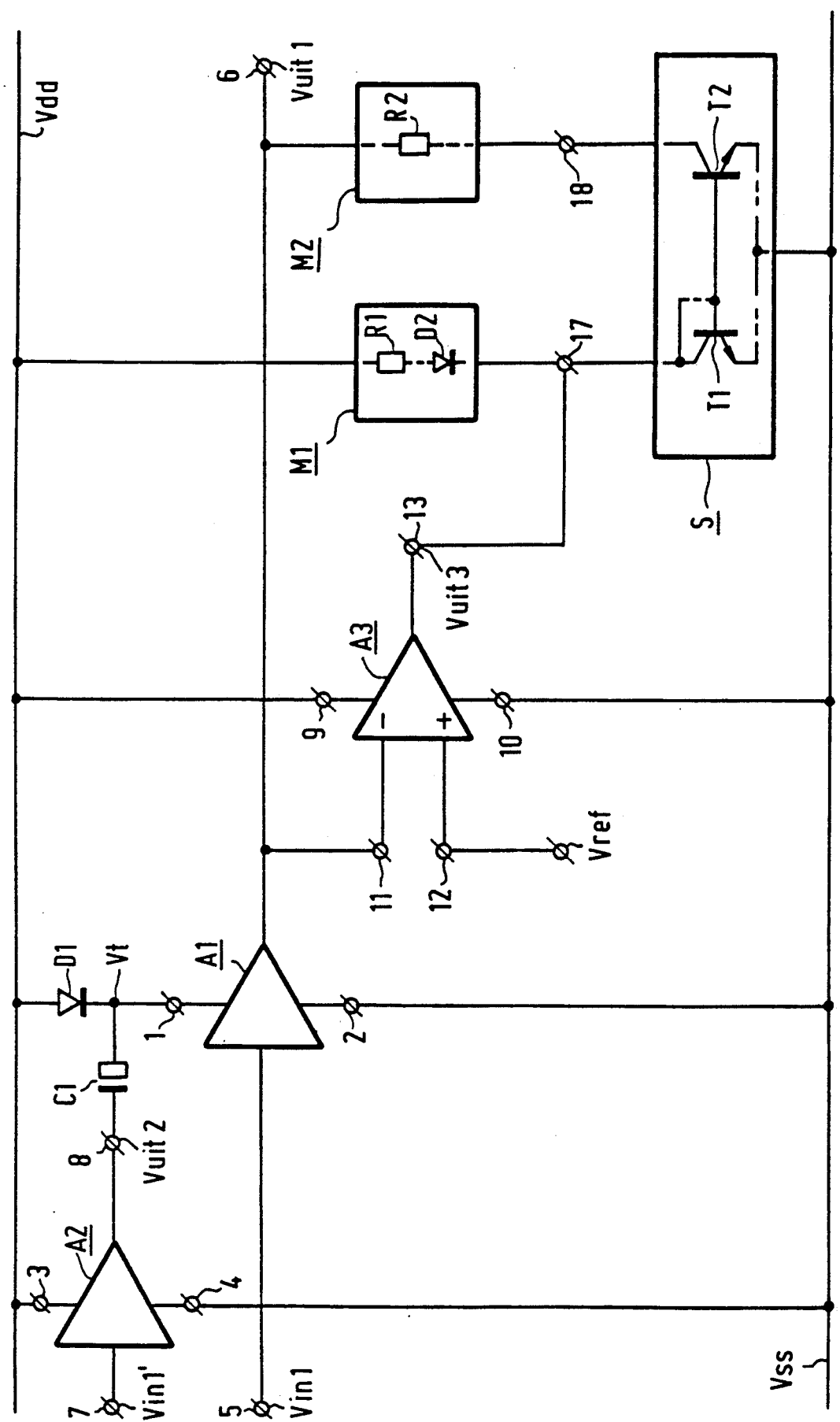
FIG. 1 shows an embodiment of an amplifier arrangement in accordance with the invention.

FIG. 1 shows an embodiment of an amplifier arrangement in accordance with the invention. The arrangement comprises a first amplifier A1, which has a terminal 1 and a terminal 2, which are respectively coupled to a supply voltage terminal Vdd by a diode D1 and to a supply voltage terminal Vss, and which has an input terminal 5 for receiving an input signal Vin1 and an output terminal 6 for supplying an output signal Vuit1, and a second amplifier A2, which has a terminal 3 and a terminal 4, which are coupled to the supply voltage terminals Vdd and Vss respectively, and which has as an input terminal 7 for receiving an input signal Vin' and an output terminal 8 for supplying the output signal Vuit2. A capacitor C1 couples the output terminal 8 to the terminal 1, which carries a boosting voltage Vt. The arrangement further comprises a third amplifier A3 and a signal-follower circuit comprising first means M1, second means M2 and a current-mirror circuit S. The third amplifier A3 is coupled to the supply voltage terminal Vdd via a terminal 9 and to the supply voltage terminal Vss via a terminal 10. The third amplifier A3 further comprises an inverting input terminal 11, which is coupled to the output terminal 6, a non-inverting input terminal 12, which carries a reference signal Vref, and an output terminal 13, which carries an output signal Vuit3. The means M1 is coupled to the supply voltage terminal Vdd and, via a terminal 17, to the current-mirror circuit S, and the means M2 are coupled to the output terminal 6 and, via a terminal 18, to the current-mirror circuit S, which circuit is also coupled to the supply voltage terminal Vss. The input signals Vin1 and Vin1' are related to one another. Vin1' may be substantially equal to Vin1 or may be a rectified replica of Vin1. The amplifier A1 amplifies the input signal Vin to form the output signal Vuit1, which is applied to a load via the output terminal 6. The amplifier A2, however, only amplifies the input signal Vin1' to form the output signal Vuit2 when a threshold value is exceeded. The output signal Vuit2 is then applied to the terminal 1 via the capacitor C1, which terminal will consequently track the variations of the output signal Vuit2. If the input signal Vin1' does not exceed said threshold value the amplifier A1 will supply the output signal Vuit1 without being limited by the supply voltage on the supply voltage terminal Vdd or Vss. For this purpose the direct voltage level on the output terminal 6 is centered between the boosting voltage Vt and the supply voltage Vss. Thus, the amplifier A1 can be operated fairly deep in the output voltage swing without causing the boosting voltage Vt to be varied. When the input signal Vin1' increases, the threshold value will be exceeded, causing the output signal Vuit2 to become non-zero and the boosting voltage to vary proportionally. However, in order to ensure that the output voltage Vuit1 is not limited by the supply voltage Vss, the direct voltage level should also vary. For this purpose the output signal Vuit1 is compared with the reference signal Vref. If said threshold value is exceeded this comparison results in the drive of the current-mirror circuit S being taken over. The diode D2 and the means M1 will then be cut off and the amplifier A3 will drive the current-mirror circuit S. This current-mirror circuit S corrects the direct voltage level on the output terminal 6 via the means M2. FIG. 1 shows a possible construction for the means M1 and M2 and for the current-mirror circuit S. The means M1 comprise a diode D2 and a resistor R1 coupled in series. The diode D2 serves to provide a voltage drop which is related to that between the supply voltage terminal Vdd and the output terminal 13. For this purpose a plurality of diodes may be employed, which also cause an identical temperature dependence for the two drives of the current-mirror circuit S. The means M2 comprises a resistor R2 and the current-mirror circuit S comprises two transistors T1 and T2 arranged as a current mirror. The resistor R1 mainly defines the direct voltage setting. In the absence of variations of the boosting voltage Vt on the terminal 1, the diode D2 and the resistor R1 together with the diode-connected transistor T1 effect a voltage division, the current mirror (T1, T2) being driven by the signal on the terminal 17. Both the values and the ratio between the values of the resistors R1 and R2 can be optimized by selecting unequal surface areas for the transistors T1 and T2. The value of the resistor R2 determines the direct voltage level on the output terminal 6 on the basis of the current through the transistor T2. Moreover, the means M2 can provide feedback of the output signal Vuit1 to the input signal Vin1. This is possible for example by applying the input signal Vin1 to an input buffer, which by means of a further resistor is coupled to the terminal 18. The resistor R2 together with the further resistor then determines the feedback factor.

Figure 2:
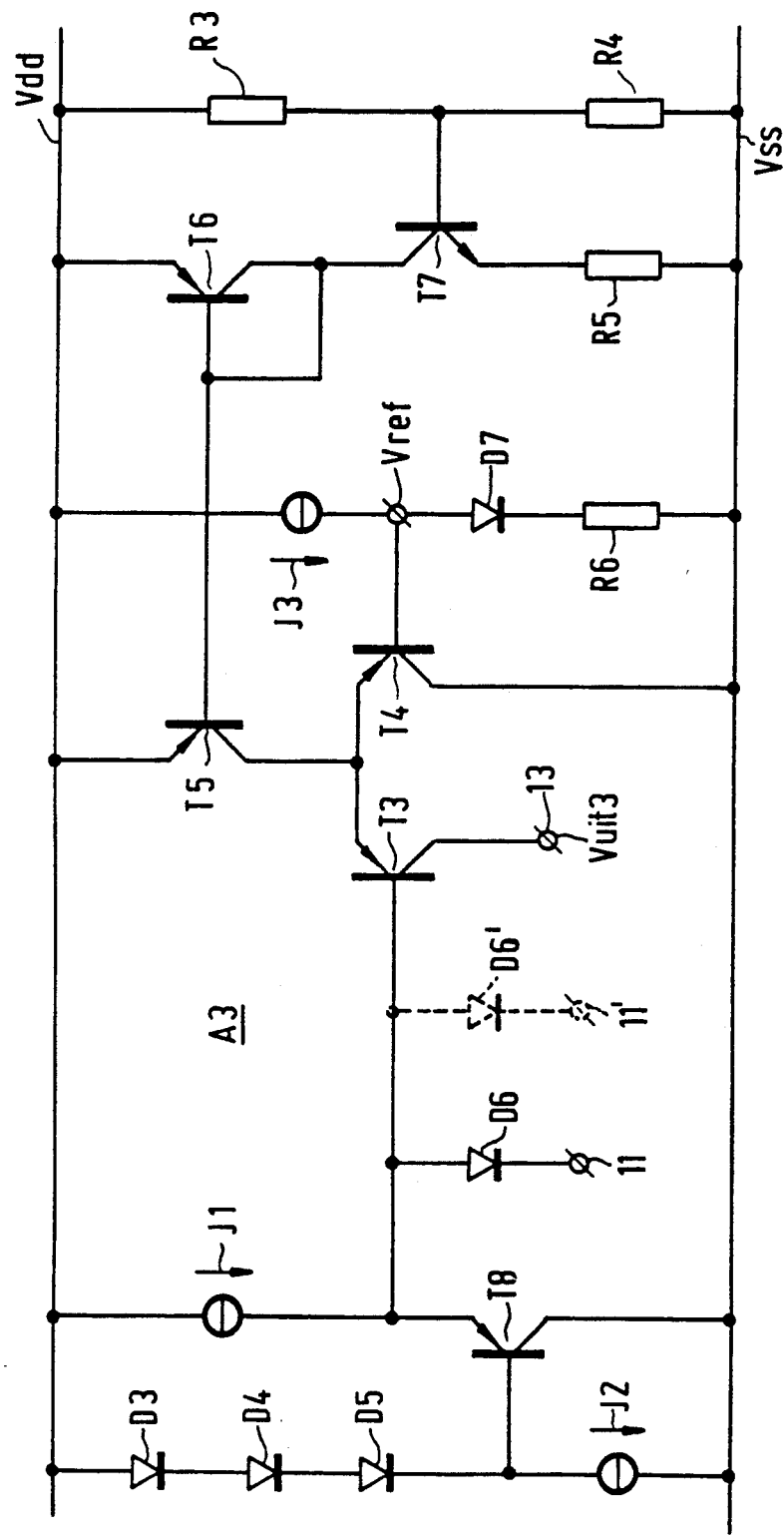
FIG. 2 shows an example of the third amplifier of an amplifier arrangement in accordance with the invention.

FIG. 2 shows an example of the third amplifier of an amplifier arrangement in accordance with the invention. In this amplifier a transistor T3 and a transistor T4 constitute a differential pair, whose mutually-coupled first main electrodes are connected to a current source circuit. This circuit is realized by coupling a transistor T5 and a transistor T6 to form a current mirror. The first main electrodes of the two transistors are connected to the supply voltage terminal Vdd and the second main electrode of the transistor T5 is coupled to the differential pair (T3, T4). The second main electrode of the transistor T6 is coupled to the control electrodes of the current mirror (T5, T6) and, via a series arrangement of the main current path of a transistor T7 and a resistor R5, to the supply voltage terminal Vss. The transistor T7 is of a conductivity type opposite to that of the other transistors in the present example of the third amplifier A3. The control electrode of the transistor T7 is connected to the two supply voltage terminals Vdd and Vss by a resistor R3 and a resistor R4 respectively. The ratio between the values of these resistors R3 and R4 determines the voltage between the control electrode and the first main electrode of the transistor T7 and the voltage across the resistor R5. As a result of this, the current supplied to the differential pair (T3, T4) is proportional to the voltage difference between the supply voltage terminals Vdd and Vss. The control electrode of the transistor T3 is coupled to the two supply voltage terminals Vdd and Vss by a current source J1 and the main current path of a transistor T8 respectively. The control electrode of this transistor T8 is also coupled to the two supply voltage terminals Vdd and Vss by means of a number of series-connected diodes D3, D4, D5 and a current source J2 respectively. In addition, the control electrode of the transistor T3 is coupled to the terminal 11 by a diode D6, which terminal carries the output signal Vuit1, as is shown in FIG. 1. If the third amplifier A3 is employed in a bridge amplifier arrangement the control electrode of the transistor T3 is also coupled to a terminal 11' by means of a diode D6'. The two output terminals of the bridge amplifier, between which a load is coupled, are then connected to the terminals 11 and 11', the diodes D6 and D6' operating as an OR gate. They are turned on when the output signal on the terminal 11 or the terminal 11' tends to be limited by the supply voltage on the supply voltage terminal Vss. The turn-on instant depends on the reference signal Vref on the control electrode of the transistor T4. This reference signal Vref is obtained by coupling said control electrode to the supply voltage terminals Vdd and Vss by a current source J3 and a series arrangement of a diode D7 and a resistor R6 respectively. It is possible to arrange a plurality of diodes in series with the diode D7 but the number of the diodes should be equal to the number of diodes between the control electrode of the transistor T3 and the terminal 11. This requirement is based on the function of the resistor R6. The voltage across this resistor determines the threshold at which the output signal Vuit1, which appears on the terminal 11, tends to be limited and the signal-follower circuit should be driven. If the boosting voltage Vt does not vary, the reference signal Vref will be smaller than the voltage on the control electrode of the transistor T3. Consequently, the transistor T4 will be turned on and the transistor T3 will be cut off. The voltage on the control electrode of the transistor T3 is then dictated by the diodes D3, D4 and D5, the current sources J1 and J2, and the transistor T8. The diode D6 will be cut off because the voltage on the terminal 11 will remain higher than the voltage across the resistor R6. If the output signal Vuit1 tends to be limited, resulting in variations of the boosting voltage Vt, the voltage on the terminal 11 will become smaller than the voltage across the resistor R6. The diode D6 will be turned on and for this purpose it will receive current from the current source J1. The transistors T8 and T4 will be cut off as a result of the voltage drop on the control electrode of the transistor T3. This transistor now drives the signal-follower circuit via the output signal Vuit3 on the terminal 13. As a result of capacitive effects or the provision of a capacitance between the terminal 13 and the supply voltage Vss, the drive acts with a specific delay, so that rapid fluctuations are precluded and the direct voltage level on the terminal 6 is corrected gradually. When the third amplifier A3 is employed in a bridge amplifier arrangement the operation is similar. The transistor T3 can then also be turned on by the voltage on the terminal 11'. In order to control the further direct voltage level on a further output terminal the current-mirror circuit S will then comprise a further transistor arranged in parallel with the transistor T2. This further transistor is then also coupled to the further output terminal by the means M2. For controlling the two direct voltage levels said means comprise two similar circuits, each comprising for example a resistor.

The invention is not limited to the embodiments disclosed herein. Within the scope of the invention several modifications are conceivable to those skilled in the art. For example, the means as well as the third amplifier and the current-mirror circuit may be constructed in various manners. Both current control and voltage control of the current-mirror circuit is possible. In addition, it is possible to drive the signal-follower circuit via the third amplifier with a signal proportional to the first output signal, such as for example the input signal or the boosting voltage.

We claim:

1. An amplifier arrangement comprising a first amplifier for amplifying an input signal, the first amplifier comprising a first terminal for receiving a boosting voltage, which terminal is coupled to a first supply voltage terminal via a unidirectional element to receive a first supply voltage, a second terminal, which is coupled to a second supply voltage terminal to receive a second supply voltage, a first input terminal for receiving the input signal, and a first output terminal for supplying a first output signal superimposed on a specific direct voltage level, and a second amplifier for varying the boosting voltage on the first terminal as a function of the input signal, the second amplifier comprising a third and a fourth terminal, which are coupled to the first and the second supply voltage terminal, respectively, a second input terminal for receiving a measure of the input signal and a second output terminal for supplying a second output signal, which output terminal is coupled to the first terminal by means of a capacitor, characterized in that the amplifier arrangement further comprises a signal-follower circuit for establishing the direct voltage level on the first output terminal and a third amplifier for driving the signal-follower circuit depending upon a comparison between the first output signal and a reference signal, the third amplifier comprising a third input terminal for receiving a third input signal, which input terminal is coupled to the first output terminal, and a third output terminal for supplying a third output signal, which output terminal is coupled to the signal-follower circuit.

2. An amplifier arrangement as claimed in claim 1, characterized in that the signal-follower circuit comprises first means, second means and a current-mirror circuit having an input terminal and an output terminal, the input terminal of the current-mirror circuit being coupled both to the first supply voltage terminal by the first means and to the third output terminal, and the output terminal of the current-mirror circuit being coupled to the first output terminal by the second means.

3. An amplifier arrangement as claimed in claim 2, characterized in that the first means comprises at least a unidirectional element and a resistor, which are coupled in series between the input terminal of the current-mirror circuit and the first supply voltage terminal.

4. An amplifier arrangement as claimed in claim 2, characterized in that the second means comprises at least a resistor, which is coupled between the output terminal of the current-mirror circuit and the first output terminal.

5. An amplifier arrangement as claimed in claim 1, characterized in that the third amplifier comprises a differential stage comprising at least two transistors each having a first main electrode, a control electrode and a second main electrode, a current source circuit and a reference-signal circuit, the first main electrodes being coupled both to one another and to the current-mirror circuit, one control electrode being coupled to the first output terminal, the other control electrode being coupled to the reference-signal circuit to receive the reference signal, and one second main electrode being coupled to the third output terminal.

6. An amplifier arrangement as claimed in claim 2, characterized in that the second means comprise at least a resistor, which is coupled between the output terminal of the current-mirror circuit and the first output terminal.

* * * * *